United States Patent
Kropfitsch et al.

(10) Patent No.: US 9,136,862 B2
(45) Date of Patent: Sep. 15, 2015

(54) QUANTIZER

(71) Applicant: Infineon Technologies AG, Neubiberg (DE)

(72) Inventors: Michael Kropfitsch, Koettmannsdorf (AT); Jose Luis Ceballos, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/138,261

(22) Filed: Dec. 23, 2013

(65) Prior Publication Data

US 2015/0180500 A1   Jun. 25, 2015

(51) Int. Cl.
| | |
|---|---|
| H03M 3/00 | (2006.01) |
| H04N 7/26 | (2006.01) |
| H03M 1/34 | (2006.01) |
| G04F 10/00 | (2006.01) |
| H03M 1/36 | (2006.01) |

(52) U.S. Cl.
CPC ............. H03M 1/345 (2013.01); G04F 10/005 (2013.01); H03M 1/36 (2013.01)

(58) Field of Classification Search
CPC ......... H03M 3/424; H03M 1/00; H03M 1/12; H03M 2201/20; H03M 1/345; H03M 1/36; G04F 10/005
USPC ................................................. 341/143, 200
See application file for complete search history.

(56) References Cited

U.S. PATENT DOCUMENTS

| | | | |
|---|---|---|---|
| 3,787,863 A * | 1/1974 | Watanabe et al. | 342/424 |
| 8,471,743 B2 | 6/2013 | Huang | |
| 8,593,318 B2 | 11/2013 | Kaald | |
| 2006/0083343 A1* | 4/2006 | Roederer et al. | 375/375 |
| 2012/0081185 A1* | 4/2012 | Wang et al. | 331/25 |
| 2012/0112936 A1* | 5/2012 | Huang | 341/110 |

FOREIGN PATENT DOCUMENTS

WO        2006094985 A1    9/2006

OTHER PUBLICATIONS

Hajimiri, A., et al., "A General Theory of Phase Noise in Electrical Oscillators," IEEE Journal of Solid-State Circuits, vol. 33, No. 2, Feb. 1998, pp. 179-194.

Taylor, G., et al., "A Mostly-Digital Variable-Rate Continuous-Time Delta-Sigma Modulator ADC," IEEE Journal of Solid-State Circuits, vol. 45, No. 12, Dec. 2010, pp. 2634-2646.

* cited by examiner

*Primary Examiner* — Jean B Jeanglaude
(74) *Attorney, Agent, or Firm* — Slater & Matsil, L.L.P.

(57) ABSTRACT

In one embodiment the quantizer includes a signal-to-phase converter configured to generate a phase signal according to an input signal and a phase difference digitization block configured to generate a quantization output according to differentiated samples of the phase signal, where the phase signal generated by the signal-to-phase converter has a sinusoidal shape.

21 Claims, 7 Drawing Sheets

QUANTIZER

TECHNICAL FIELD

The disclosure relates to quantizers, in particular quantizers with signal-to-phase converters such as controllable oscillators.

BACKGROUND

Conventional continuous-time delta-sigma analog-to-digital converters typically include an analog loop filter applied to an analog input signal and a low-resolution clocked quantizer that provides a digital output therefrom. The output from the quantizer is input to a digital-to-analog converter (DAC), wherein the quantized signal from the quantizer is converted to an analog domain signal and fed back to the loop filter. The quantizer may be replaced with a quantizer based on a voltage-controlled oscillator (VCO), which leverages the phase of the VCO. However, using a VCO-based quantizer instead of a conventional quantizer may affect the performance and accuracy of the DAC. A typical conventional VCO phase quantizer includes a multi-stage multi-phase VCO connected to a multi-stage phase quantizer. The multi-stage phase quantizer determines the phase of the VCO by comparing the phases of the VCO for a particular sample to a reference phase; it then generates a quantized phase difference value. However, a conventional VCO quantizer may also produce output nonlinearities that can affect the performance and accuracy of the DAC. Therefore, it is important that the multi-phase oscillator is highly linear.

SUMMARY OF THE INVENTION

The quantizer includes a signal-to-phase converter configured to generate a phase signal according to an input signal, as well as a phase difference digitization block configured to generate a quantization output according to differentiated samples of the phase signals, wherein the phase signal generated by the signal-to-phase converter has a sinusoidal shape.

The quantization method for generating a quantization output of an input voltage includes generating a sinusoidal phase signal according to the input voltage and generating a quantization output according to differentiated samples of the phase signals.

DETAILED DESCRIPTION OF ILLUSTRATIVE EMBODIMENTS

Figure 1:
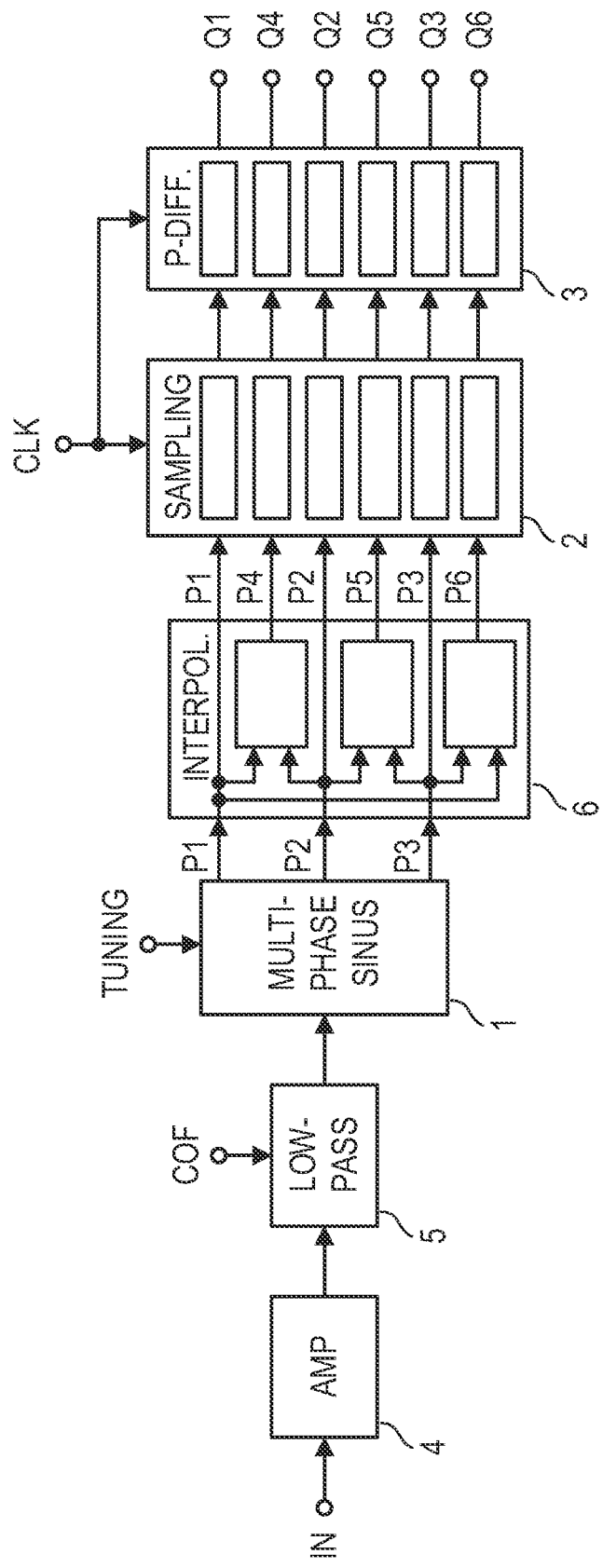
FIG. 1 is a block diagram of a first implementation of a quantizer based on a multi-phase oscillator.

Referring to FIG. 1, which is a diagram illustrating a first exemplary implementation of a quantizer, the quantizer includes a signal-to-phase converter that is realized by a (multi-phase) oscillator with controllable frequency such as current- (or voltage-) controlled oscillator 1, as well as a phase difference digitization block realized by a combination of sampling block 2 and phase differentiation block 3. Current-controlled oscillator 1 generates p (e.g., p=3) sinusoidal signals P1-P3, which have the same frequency but different phases, as shown in detail in FIG. 5. Sampling block 2 is arranged to sample the p sinusoidal signals by using sampling clock CLK with a sampling frequency and accordingly generate p quantized phase signals to the subsequent phase difference digitization block 3. Phase difference digitization block 3 is coupled to sampling block 2 and is arranged to generate p quantization output signals Q1-Qp, clocked with clock CLK, by differentiating the quantized phase signals. Sampling block 2 includes at least p samplers, and phase difference digitization block 3 includes at least p phase differentiators.

At least one of the following optional modules may be additionally employed: amplifier 4, which is connected upstream of current- (or voltage-) controlled oscillator 1 and which provides a current (or voltage) output for current- (or voltage-) controlled oscillator 1 from quantizer input signal IN (e.g., a current or a voltage); low-pass filter 5, which is connected upstream of current- (or voltage-) controlled oscillator 1 and upstream or downstream of amplifier 4 and which is configured to filter out unwanted high-frequency components in the input signal; and p=3 interpolators 6, which are each supplied with two adjacent signals of the p quantization output signals Q1 to Qp and which provide p further (interpolated) quantization output signals Qp+1 to Q2p. The p further quantization output signals Qp+1 to Q2p may be fed to the phase difference digitization block, which may then include 2p instead of p samplers in sampling block 2 and, accordingly, 2p phase detectors in phase differentiation block 3. The quantizer shown in FIG. 1 provides 2p quantization output signals Q1-Q2p, which is Q1-Q6 when p=3, as shown. The cutoff frequency of low-pass filter 5 may be adjusted under control of signal COF.

Figure 2:
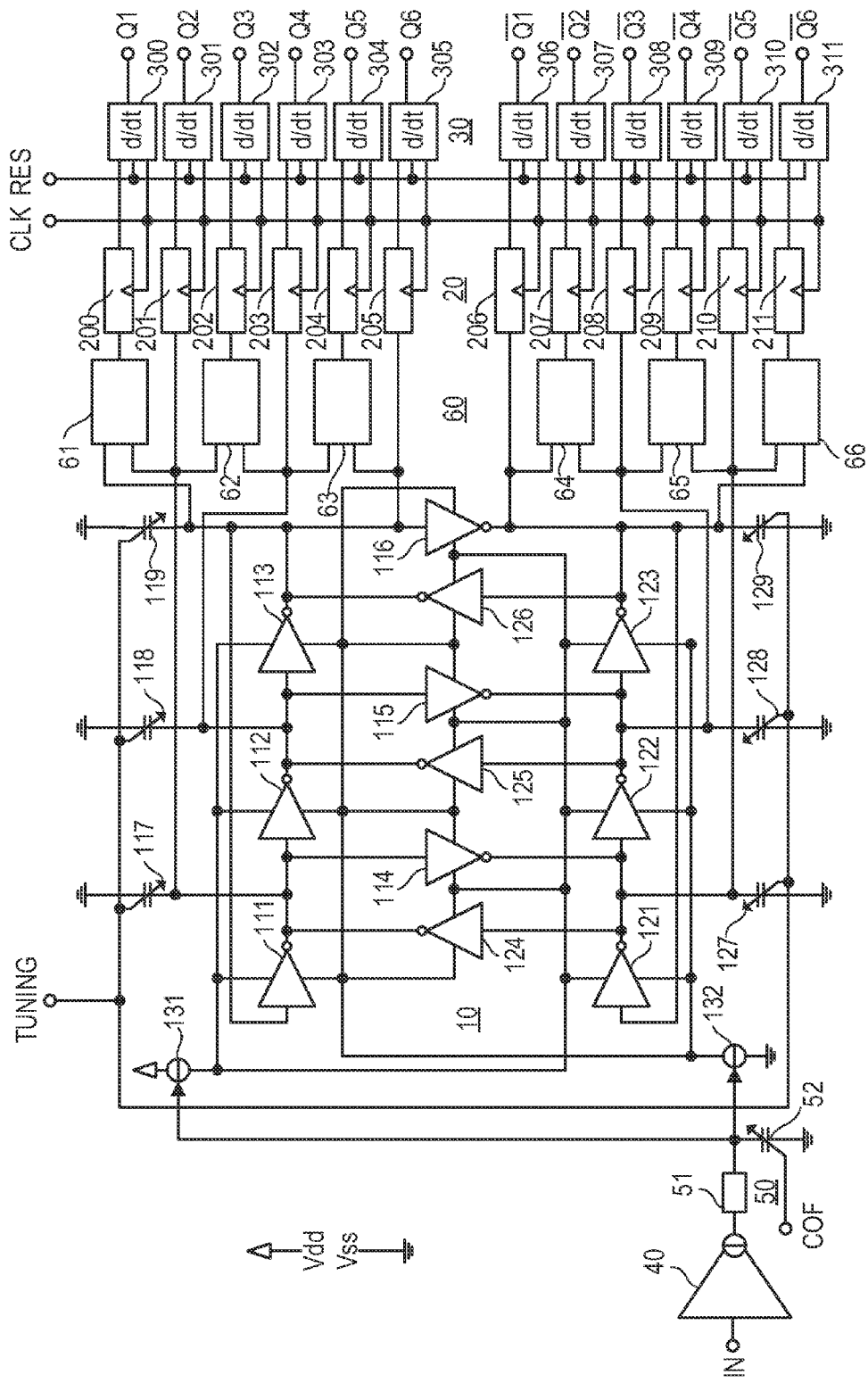
FIG. 2 is a block diagram of a second implementation of a quantizer based on a differential multi-phase oscillator.

The FIG. 2 depicts a second exemplary implementation of a quantizer, which has a partly differential structure. The quantizer shown in FIG. 2 includes an amplifier 40, which may be, for example, a transconductance amplifier that receives voltage input IN and provides a current output. The current output by amplifier 40 is supplied via low-pass filter 50, which is connected downstream of amplifier 40 to a subsequent differential current-controlled 3-stage ring oscillator 10, whose three output signals have different phases but a common frequency that depends on the current provided by amplifier 40. Again, the cutoff frequency of low-pass filter 50 may be controllable by signal COF. For example, low-pass filter 50 may include an RC low-pass element with resistive element 51 and capacitive element 52, whose capacitance is controllable by signal COF, in a parallel path, respectively. Alternatively, resistive element 51 may be controllable instead of capacitive element 52.

Differential ring oscillator 10 also supplies its three differential output signals directly through a 3×2-stage phase interpolation block 60 to a 6×2-stage differential phase difference digitization block for phase quantization. Phase interpolation block 60 includes, for example, six differential phase interpolators 61-66, which are each supplied with one of the differential ring oscillator output signals having adjacent phases and which generate by interpolation an output signal, each with a phase between the phases of the respective two differential ring oscillator output signals. Six differential signals having the same frequency but different phases are thus supplied to the phase difference digitization block.

The phase difference digitization block may include a 6×2-stage differential sampling block 20 and a subsequent 6×2-stage differential phase differentiation block 30. In sampling block 20, the multi-phase signals from ring oscillator 10 and interpolators 61-66 are sampled with clock CLK and supplied as sampled phase signals to phase differentiation block 30, where they are differentiated according to 1/Ts, in which Ts is the reciprocal sampling frequency. Sampling block 20 includes six differential pairs of samplers 200-211, which may be D-flip-flop circuits or any other suitable circuits and which are clocked with clock CLK. Phase differentiation block 30 includes six pairs of phase differentiators (d/dt) and supplies six differential output signals Q1-Q6 and $\overline{Q1}$-$\overline{Q6}$ as a result of the differentiation of the sampled phase signals. The phase differentiators 300-311 may each be implemented with a delay element and an XOR gate, as shown in detail in FIG. 6.

The ring oscillator shown in FIG. 2 has a differential circuit structure in which a first oscillator ring is made up of three cascaded inverting delay stages 111, 112 and 113. Between successive stages, a node is formed by an output of an upstream stage and an input of a downstream stage. Stage 113 has an output looped back to the input of stage 111, also forming a node of the oscillator ring. A second oscillator ring is made up of three cascaded inverting delay stages 121, 122 and 123. Again, between successive stages, a node is formed by the output of one upstream stage and an input of one downstream stage, and stage 123 has an output looped back to the input of stage 121, also forming a node of the oscillator ring.

The nodes between stages 111 and 112, 112 and 113 and 113 and 111 of the first oscillator ring are connected to the nodes between stages 121 and 122, 122 and 123 and 123 and 121 of the second oscillator ring via pairs of inverters 114 and 124, 115 and 125 and 116 and 126, respectively. In each inverter pair, an input of a first inverter is connected with an output of a second inverter. Accordingly, corresponding nodes of the two oscillator rings are coupled by two inverters in opposite directions, thereby forcing corresponding nodes to be synchronized at exactly 180° of mutual phase shift. As the inverters may be realized in CMOS technology, which allows for a full-swing output (i.e., the output voltage is rail-to-rail), the nodes in both oscillator rings may provide also be full-swing outputs.

All inverters are supplied by two current sources 131 and 132, wherein 132 connects one supply line of the inverters to ground Vss and 131 connects the other supply line to supply voltage Vdd. To tune the oscillator rings to the desired frequency pulling range, current sources 131 and 132 are controlled by the current from amplifier 40. To further tune the oscillator rings to the desired frequency pulling range and adapt the signal shape of the output signals, each node of both oscillator rings is connected to ground Vss via an associated variable capacitive element 117-119 in the first ring and 127-129 in the second ring. Basically, capacitive elements 117-119 and 127-129 can have a continuously variable capacitance or a discontinuously controlled capacitance. The capacity of capacitive elements 117-119 and 127-129 is controlled according to tuning signal TUNING. The differential phase signals are output at the outputs of inverter stages 111, 112 and 113, and their inverse signals are output at the outputs of inverter stages 121, 122 and 123.

Figure 3:
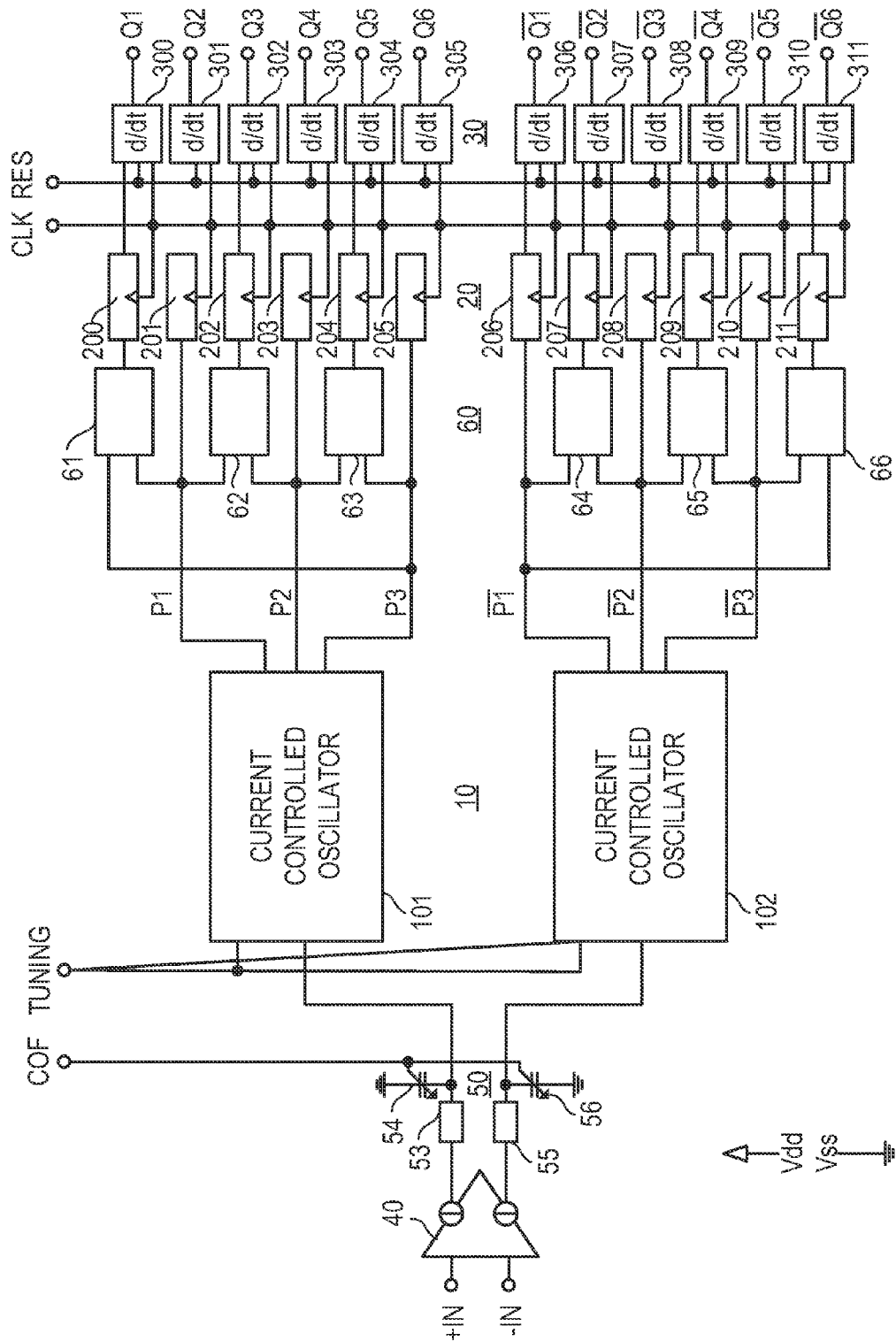
FIG. 3 is a block diagram of a second implementation of a quantizer based on two differential multi-phase oscillators.

In the quantizer shown in FIG. 2, alternative implementations particularly of amplifier 40, low-pass filter 50 and oscillator 10 may be employed as illustrated in FIG. 3. For example, amplifier 40 may be a differential-type transconductance amplifier with differential inputs −IN and +IN. The two output currents provided by amplifier 40 are sent through differential low-pass filter 50 with two RC elements to two current-controlled multi-phase oscillators 101 and 102. Oscillator 101 receives one of the differential output signals of amplifier 40 and generates three phase signals P1-P3 therefrom. Oscillator 102 receives the other of the differential output signals of amplifier 40 and generates three phase signals $\overline{P1}$-$\overline{P3}$ therefrom. Phase signals P1-P3 and $\overline{P1}$-$\overline{P3}$ are then supplied in connection with interpolators 61-66 to the same phase difference digitization block with samplers 200-211 and differentiators 300-311 as in the exemplary quantizer shown in FIG. 2.

Figure 4:
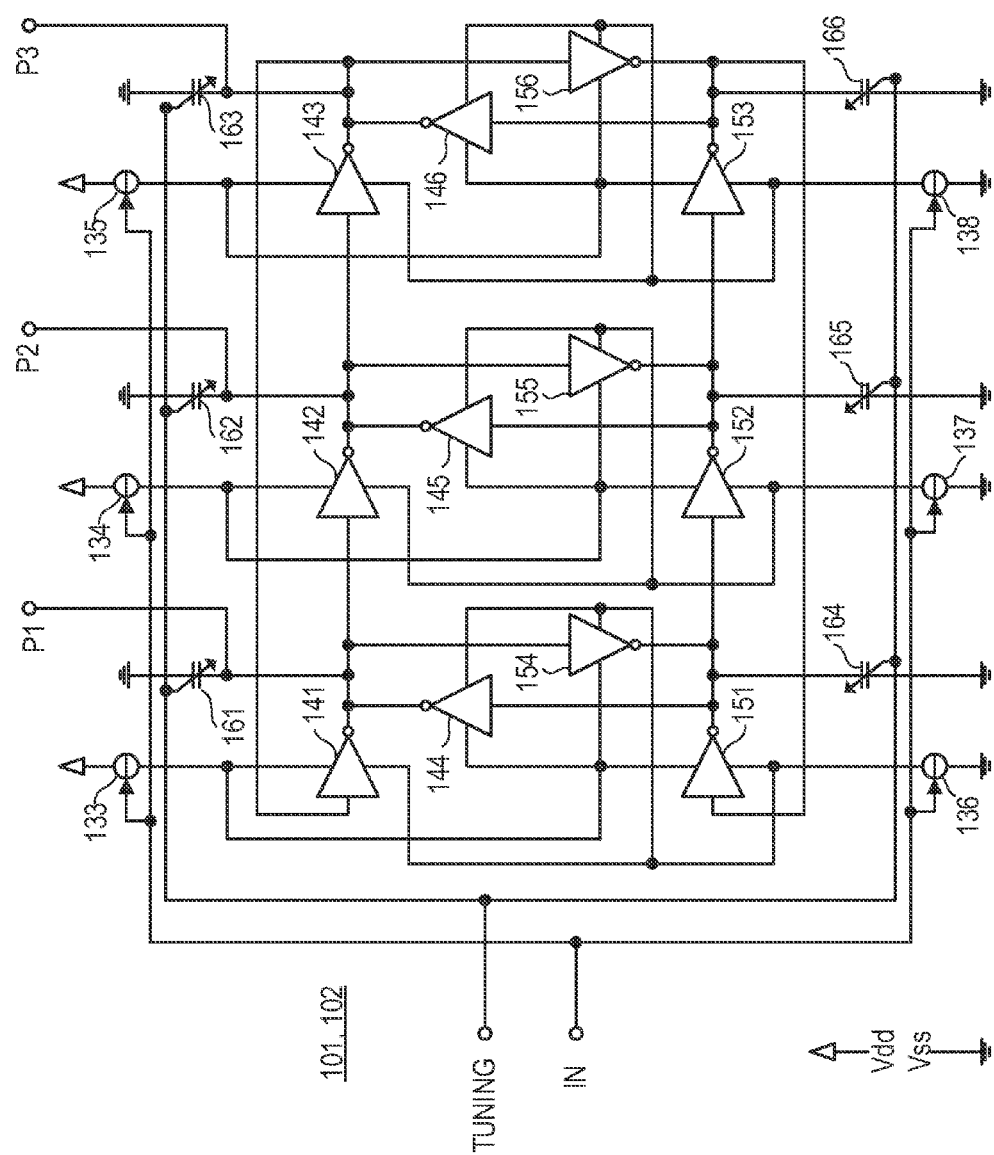
FIG. 4 is a block diagram of an exemplary implementation of an oscillator applicable in the quantizer shown in FIG. 3.

FIG. 4 depicts an exemplary implementation of an oscillator applicable as oscillators 101 and 102 in the quantizer shown in FIG. 3. The oscillator shown is a differential ring oscillator with a first oscillator ring that is made up of three cascaded inverting delay stages 141, 142 and 143. Between successive stages, a node is formed by an output of an upstream stage and an input of a downstream stage. Stage 143 has an output looped back to the input of stage 141, which also forms a node of the oscillator ring. A second oscillator ring is made up of three cascaded inverting delay stages 151, 152 and 153. Again, between successive stages, a node is formed by an output of an upstream stage and an input of a downstream stage, and stage 153 has an output looped back to the input of stage 151, which also forms a node of the oscillator ring.

The nodes between stages 141 and 142, 142 and 143 and 143 and 141 of the first oscillator ring are connected to the nodes between stages 121 and 122, 122 and 123 and 123 and 121 of the second oscillator ring via pairs of inverters 114 and 124, 115 and 125 and 116 and 126, respectively. In each inverter pair, an input of a first inverter is connected with an output of a second inverter. Accordingly, corresponding nodes of the two oscillator rings are coupled by two inverters in opposite directions, thereby forcing corresponding nodes to be synchronized at exactly 180° of mutual phase shift.

Pairs of inverters 141 and 151, 142 and 152 and 143 and 153 and the associated pairs of inverters 114 and 124, 115 and 125 and 116 and 126, respectively, are each supplied by two current sources 133 and 136, 134 and 137 and 135 and 138, respectively; current sources 136, 137 and 138 of each pair connect one supply line of the respective inverter to ground Vss, and current sources 133, 134 and 135 connect the other supply line of the respective inverter to supply voltage Vdd. To tune the oscillator rings to the desired frequency pulling range, current sources 133-138 are controlled by one of the differential currents from amplifier 40. To further tune the oscillator rings to the desired frequency pulling range and adapt the signal shape of the output signals, each node of both oscillator rings is connected to ground Vss via an associated variable capacitive element 117-119 in the first ring and 127-129 in the second ring. Basically, capacitive elements 117-119 and 127-129 can have a continuously variable capacitance or a discontinuously controlled capacitance. The capacity of capacitive elements 161-166 is controlled according to tuning signal TUNING. The non-differential phase signals of the oscillator are output at the outputs of inverter stages 141, 142 and 143. It is understood that oscillators 101 and 102 provide no differential signals per se. However, as two oscillators are used in the quantizer illustrated in FIG. 2 and this pair of oscillators 101 and 102 is supplied with a differential current from amplifier 40, differential phase signals P1-P3 and $\overline{P1}$-$\overline{P3}$ are generated.

Figure 5:
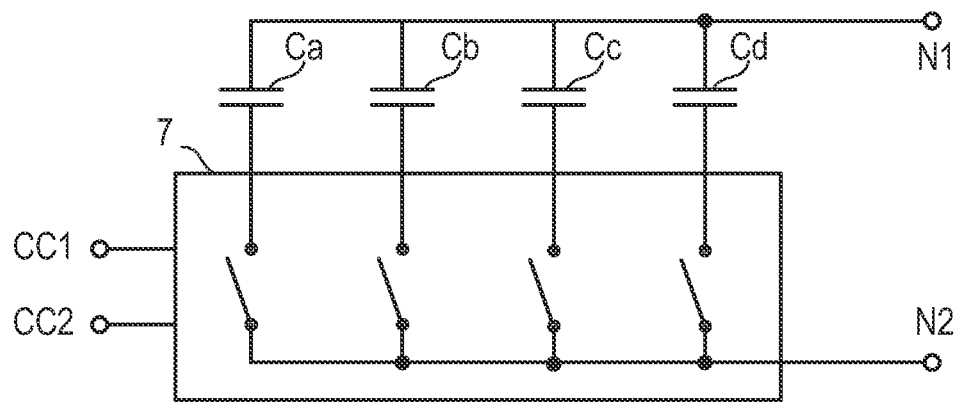
FIG. 5 is a block diagram of a switched capacitor array applicable in the quantizers shown in FIGS. 2-4.

A capacitive element with discontinuously controlled capacitance, as shown in FIG. 5, may be combined by a selective parallel connection of discrete fixed capacitors Ca, Cb, Cc and Cd. In a practical embodiment, many more discrete capacitors could be provided. The capacitors Ca-Cd all have an electrode connected to a first node N1 and an electrode connected to switching matrix 7. Switching matrix 7 has an output node N2 and control inputs CC1 and CC2, to which a multi-bit digital control signal is applied. An effective capacitance is determined by a selective parallel connection of capacitors Ca-Cd. The digital control signals determine the switching condition of matrix 7 and thus the effective capacitance across nodes N1 and N2.

Figure 6:
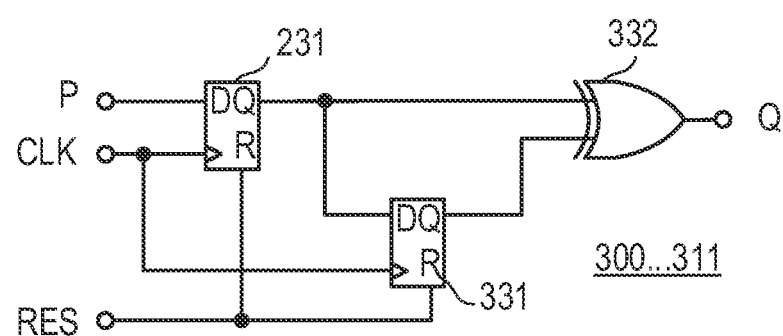
FIG. 6 is a block diagram of a sampler and phase differentiator combination applicable in the quantizers shown in FIGS. 1-3.

FIG. 6 depicts an exemplary sampling and differentiating element in a phase difference digitization block. Samplers 200-211 are realized by D-flip-flop 231, whose D input is supplied with a phase signal such as phase signal P1, P2, etc. and whose clock input receives clock CLK. D-flip-flop 231 provides output Q and can be reset by reset signal RES at its input R. Differentiators 300-311 are implemented with another D-flip-flop 331, whose D input is supplied with output Q of D-flip-flop 231 and whose clock input is also supplied with clock CLK. D-flip-flop 231 provides output Q and can be reset by reset signal RES at its input R. Differentiators 300-311, which have the transfer function $1-z^1$, also include XOR gate 332, whose inputs receive outputs Q of D-flip-flops 231 and 331, and provides at its output Q a quantizer output signal such as one of signals Q1-$\overline{Q6}$.

Figure 7:
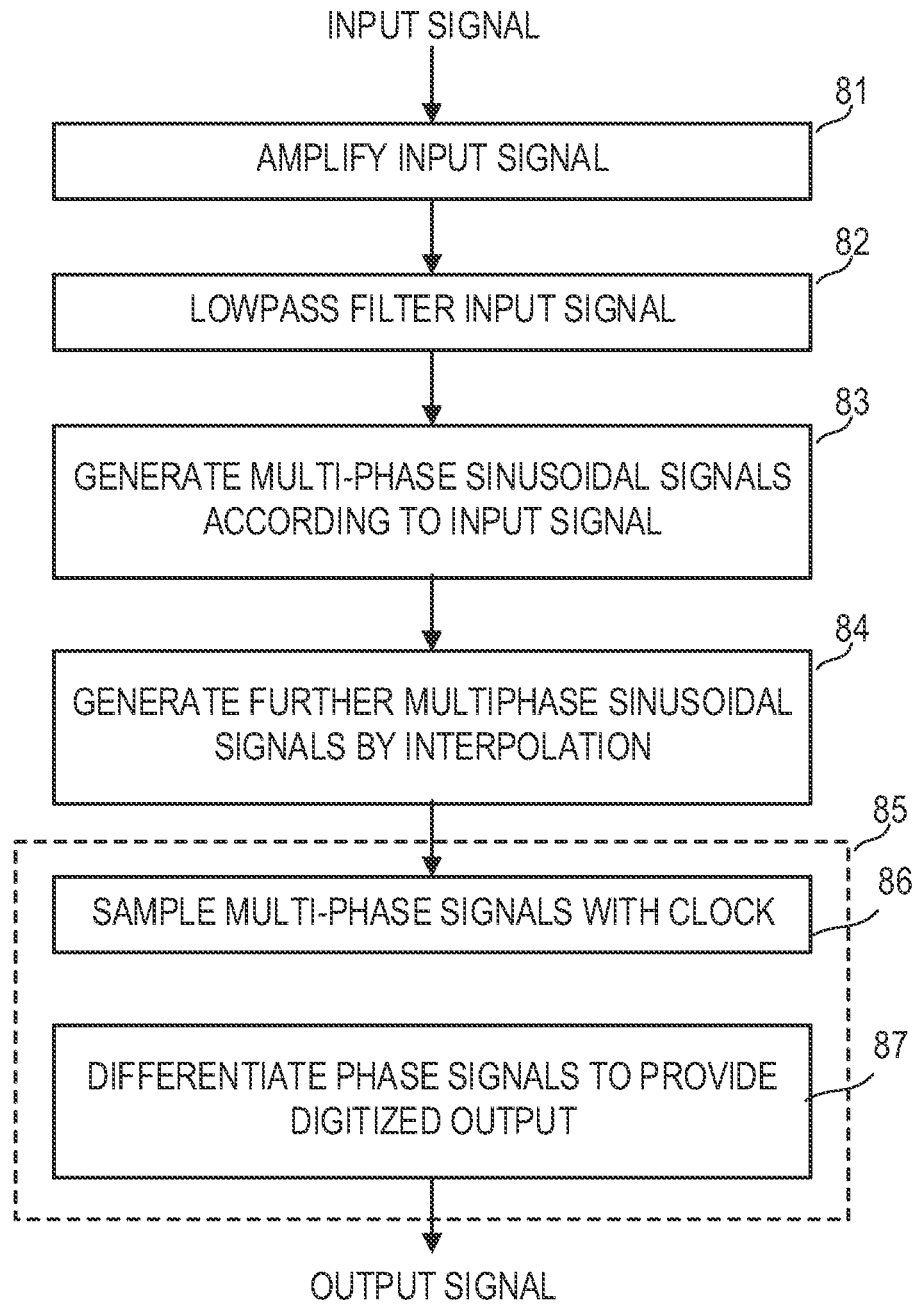
FIG. 7 is a flow chart of an exemplary quantization method for generating a quantization output of an input voltage.

Referring to FIG. 7, a quantization method for generating a quantization output of an input voltage may include generating one or more sinusoidal phase signals according to the input voltage (83), as well as generating a quantization output according to a phase difference between the phase signal(s) and a reference phase input by performing a phase difference digitization (85). One or more interpolations of these phase signals may be performed to generate further phase signals (84). Phase difference digitization may include sampling the phase signal(s) generated before and generating a quantized phase signal (86), as well as generating the quantization output by differentiating the sampled phase signal (87). The quantization method may further include low-pass filtering (82) and/or amplification (81) of the input signal before generating the phase signal(s) (86).

Figure 8:
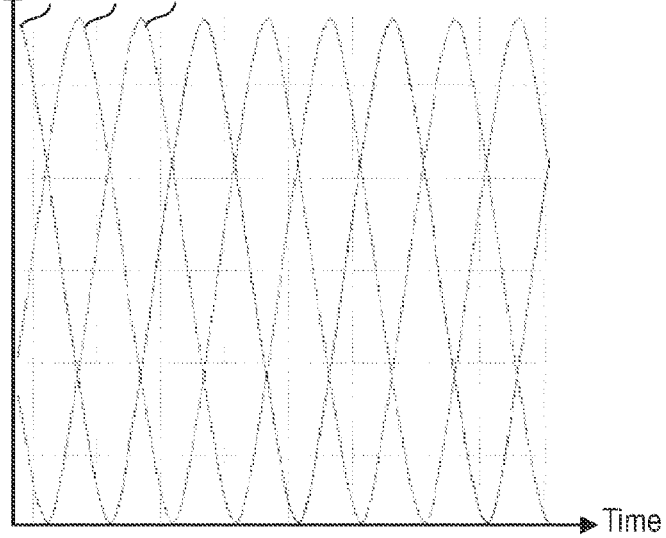
FIG. 8 is a normalized amplitude time diagram showing the outputs of the multi-phase oscillator.
Figure 9:
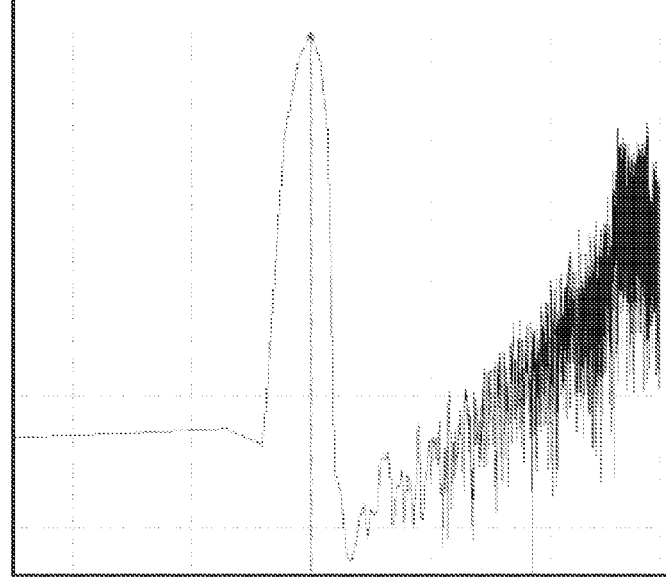
FIG. 9 is an amplitude frequency diagram showing a typical fast Fourier transformation result of the complete signal chain of the quantizer shown in FIG. 2.

FIG. 8 shows differential output signals P1-P3 of the 3-stage controlled oscillator shown in FIGS. 1, 2 and 3, which are the input signals of sampling block 2. FIG. 9 shows a typical fast Fourier transformation (FFT) result of the complete signal chain from the preamplifier input to the quantizer output, including thermal noise and flicker noise in the devices, wherein a clock frequency for the sampler of 160 MHz was used, having a bandwidth of 1 MHz. The result shows a signal close to full scale (−6 dB for a Hanning window in an FFT). The high linearity of the quantizer is mainly achieved in the oscillator, where (almost) sinusoidal output signals are generated and tuned in terms of frequency and signal shape by capacitor arrays.

As described above, exemplary implementations may include a ring oscillator supplying (almost) sinusoidal output signals, a sampler and a digital differentiator that converts the current domain input signal into phase information for each phase output. A voltage domain input signal may alternatively be used. The phase information is expressed by the rising and falling edges of the oscillator outputs, which are sampled by the samplers, introducing a quantization error in the phase domain. At the end, a digital differentiator converts the phase information back into the time information. The first-order noise shaping property for the quantization noise of oscillator-based quantizers is used.

In addition, pre-amplification and interpolation between the digital outputs can be used for further quantization noise improvements. A pseudo-differential structure may be used for further noise suppression. The preamplifier may provide voltage-to-current domain conversion, fulfilling high linearity requirements. The signal in the current domain may be distributed via current mirrors. Local feedback may be employed to reduce distortion, whereas gain adjustment may be performed with a controllable resistor network. Each current output of the preamplifier may control a fully differential oscillator, realized as a ring oscillator.

The controlled oscillator may be realized as a ring oscillator with inverters that form the inverting delay stages controlled via p-channel and n-channel current sources between the inverter and the positive supply and the inverter and the negative supply, respectively. Low-pass filtering between the input current mirrors and the ring oscillator may be employed to avoid kickback noise, which reduces signal-to-noise ratio. Each delay element generates a phase shift, dependent on the injected signal current via the current sources. Each inverter output is sampled (in the easiest implementation, via a simple D-flip-flop). The digital output may be differentiated in the digital domain with an XOR (and a shift) operation to convert back the phase information into time information and invert the integrating property of the oscillator. The sample time in the sampler is defined by the frequency of clock CLK, which defines the oscillator stability results. This oscillator-based quantizer could be a standalone block, especially for high-bandwidth applications (e.g., radar, communications) and as a part of delta-sigma analog-to-digital converters. A voltage-to-current conversion for the current-controlled oscillator input may also be realized in a loop filter in front of the quantizer in delta-sigma applications.

The delay element itself allows for tuning of the oscillator frequency and the shape of the oscillator output signals via a variable capacitance at the delay element output. In addition, the strength of the current sources is programmable, including for oscillator frequency tuning. Positive feedback within the delay element may force a defined differential output implementation under all process, voltage and temperature conditions. The sampler, interpolator and digital differentiator implementation can be realized by common logic circuits such as flip-flops, gates and inverters. However, the sampling point of the oscillator output signals defines the phase noise contribution. To adjust the sampling point, the flip-flop may allow a shift on the decision level.

The foregoing description has been presented for purposes of illustration and description. It is not intended to be exhaustive or to limit embodiments of the invention to the precise form disclosed, and other modifications and variations may be possible in light of the above teachings. The embodiments were chosen and described in order to best explain the applicable principles and their practical applications to thereby enable others skilled in the art to best utilize various embodiments and various modifications suited to the particular use contemplated. It is intended that the appended claims be construed to include other alternative embodiments except insofar as limited by the prior art.

What is claimed is:

1. A quantizer comprising:
   a signal-to-phase converter configured to generate a phase signal according to an input signal; and
   a phase difference digitization block configured to generate a quantization output according to differentiated samples of the phase signal, where the phase signal generated by the signal-to-phase converter has a sinusoidal shape.

2. The quantizer of claim 1, wherein the signal-to-phase converter is configured to generate a multiplicity of phase signals according to the input signal, and wherein the phase difference digitization block is configured to generate a multiplicity of quantization outputs according to differentiated samples of the phase signals.

3. The quantizer of claim 2, wherein the signal-to-phase converter comprises one controllable oscillator with a differential phase output.

4. The quantizer of claim 2, wherein the signal-to-phase converter comprises two controllable oscillators each with a non-differential phase output.

5. The quantizer of claim 2, wherein the signal-to-phase converter comprises at least one controllable oscillator with a differential circuit structure.

6. The quantizer of claim 1, wherein the phase difference digitization block comprises:
   a sampler configured to sample the phase signal and generate a quantized phase signal; and
   a phase differentiator coupled to the sampler and configured to generate the quantization output by differentiating the quantized phase signal(s).

7. The quantizer of claim 1, wherein the signal-to-phase converter is a voltage or current controlled sinus oscillator.

8. The quantizer of claim 1, wherein the signal-to-phase converter comprises a ring oscillator, wherein the ring oscillator comprises an oscillator ring with a number of cascaded inverting delay stages with nodes between subsequent inverting delay stages, and where the nodes of the inverting delay stages are each connected to a capacitive element and the oscillator has an oscillating frequency determined by the capacitance of the capacitive elements.

9. The quantizer of claim 8, wherein the capacitive elements have a variable capacitance.

10. The quantizer of claim 8, wherein the capacitive elements comprise a plurality of discrete capacitors and the capacitance of a capacitive element is determined by a combination of the discrete capacitors.

11. The quantizer of claim 8, wherein the inverting delay stages are connected to a power supply via controllable current sources, and wherein the oscillating frequency of the oscillator is also determined by the current provided by the current sources.

12. The quantizer of claim 1, wherein the signal-to-phase converter comprises a ring oscillator, the ring oscillator comprising:
   a first oscillator ring with a number of cascaded inverting delay stages;
   a second oscillator ring with a like number of cascaded inverting delay stages;
   a like number of inverter pairs, each consisting of a first inverter and a second inverter, an input of the first inverter being connected with an output of the second inverter and an input of the second inverter being connected with an output of the first inverter, each inverter pair connecting a node of the first oscillator ring with a node of the second oscillator ring; and
   the nodes of inverting delay stages are each connected to a capacitive element and the ring oscillator has an oscillating frequency determined by the capacitance of the capacitive elements.

13. The quantizer of claim 1, wherein a low-pass filter is connected upstream of the signal-to-phase converter.

14. The quantizer of claim 1, wherein an amplifier is connected upstream of the signal-to-phase converter.

15. The quantizer of claim 1, wherein one or more interpolators are connected downstream of the signal-to-phase converter, the interpolator(s) being configured to generate further phase signal(s).

16. A quantization method for generating a quantization output of an input signal comprising:
    generating a sinusoidal phase signal according to the input signal; and
    generating the quantization output according to differentiated samples of the phase signals.

17. The quantization method of claim 16, wherein generating the sinusoidal phase signal comprising generating a multiplicity of sinusoidal phase signals according to the input signal, and wherein generating the quantization output comprises generating a multiplicity of quantization outputs according to differentiated samples of the phase signals by performing a phase difference digitization.

18. The quantization method of claim 17, wherein performing phase difference digitization comprises:
    sampling the phase signal and generating a quantized phase signal; and
    generating the quantization output by differentiating the sampled phase signal.

19. The quantization method of claim 16, further comprising low-pass filtering of the input signal before generating the phase signal.

20. The quantization method of claim 16, further comprising amplifying the input signal before generating the phase signal.

21. The quantization method of claim 16, further comprising performing further phase signals by interpolations of a signal-to-phase converter.

* * * * *